United States Patent
Hu et al.

(10) Patent No.: US 12,199,547 B2
(45) Date of Patent: *Jan. 14, 2025

(54) RESISTANCE DETERMINATION IN AN ELECTRIC MOTOR ASSEMBLY

(71) Applicant: MCi (Mirror Controls International) Netherlands B.V., Woerden (NL)

(72) Inventors: Jinku Hu, Delft (NL); Bastiaan Huijzers, Dordrecht (NL); Hendrik Jan Meijdam, Utrecht (NL)

(73) Assignee: MCI (MIRROR CONTROLS INTERNATIONAL) NETHERLANDS B.V., Woerden (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/227,084

(22) Filed: Jul. 27, 2023

(65) Prior Publication Data

US 2023/0370000 A1    Nov. 16, 2023

Related U.S. Application Data

(63) Continuation of application No. 17/430,826, filed as application No. PCT/NL2020/050082 on Feb. 14, 2020, now Pat. No. 11,757,387.

(30) Foreign Application Priority Data

Feb. 15, 2019    (NL) .................................... 2022591

(51) Int. Cl.
*H02P 5/00*        (2016.01)
*G01P 3/48*        (2006.01)
(Continued)

(52) U.S. Cl.
CPC .............. *H02P 7/0094* (2013.01); *G01P 3/48* (2013.01); *G01R 31/346* (2013.01)

(58) Field of Classification Search
CPC ........ H02P 7/0094; H02P 29/60; H02P 21/22; H02P 61/34; G01P 3/48; G01R 31/346
See application file for complete search history.

(56) References Cited

U.S. PATENT DOCUMENTS

| 6,144,179 A | 11/2000 | Kessler et al. |
|---|---|---|
| 2012/0205186 A1 | 8/2012 | Niimi et al. |

(Continued)

FOREIGN PATENT DOCUMENTS

| CN | 102632920 A | | 8/2012 |
|---|---|---|---|
| CN | 116556799 A | * | 8/2023 |

(Continued)

*Primary Examiner* — Karen Masih
(74) *Attorney, Agent, or Firm* — Volpe Koenig

(57) ABSTRACT

An electric motor assembly is configured to determine a motor winding resistance value. Predicted values are determined for a first and second position of motor commutator sections relative to the motor brushes, with at least one of the brushes contacting different numbers of the sections in the first position and the second position. The predicted values are based on a temperature value measured by the temperature sensor and a predetermined dependence of variation of the motor resistance dependent on the temperature value. An electric motor current value is measured by a current sensor when the electric motor is substantially at standstill. A selection is made between different factors for determining the motor resistance value using the electric current value, dependent on which of the predicted values most closely corresponds to the electric current value. The motor resistance is determined using said electric current value according to the selected factor.

11 Claims, 5 Drawing Sheets

(51) Int. Cl.
*H02P 7/00* (2016.01)
*G01R 31/34* (2020.01)

(56) References Cited

U.S. PATENT DOCUMENTS

2013/0035816 A1   2/2013   Pettigrew et al.
2018/0019693 A1   1/2018   Suzuki et al.

FOREIGN PATENT DOCUMENTS

| DE | 19729238 C1 | 8/1998 |
|---|---|---|
| EP | 2487089 A2 | 8/2012 |
| EP | 2752517 A1 | 7/2014 |
| JP | 2002-127922 A | 5/2002 |
| JP | 2005-323488 A | 11/2005 |
| JP | 2011087402 | 4/2011 |
| JP | 2013082257 A | 5/2013 |
| JP | 2016-220441 A | 12/2016 |

\* cited by examiner

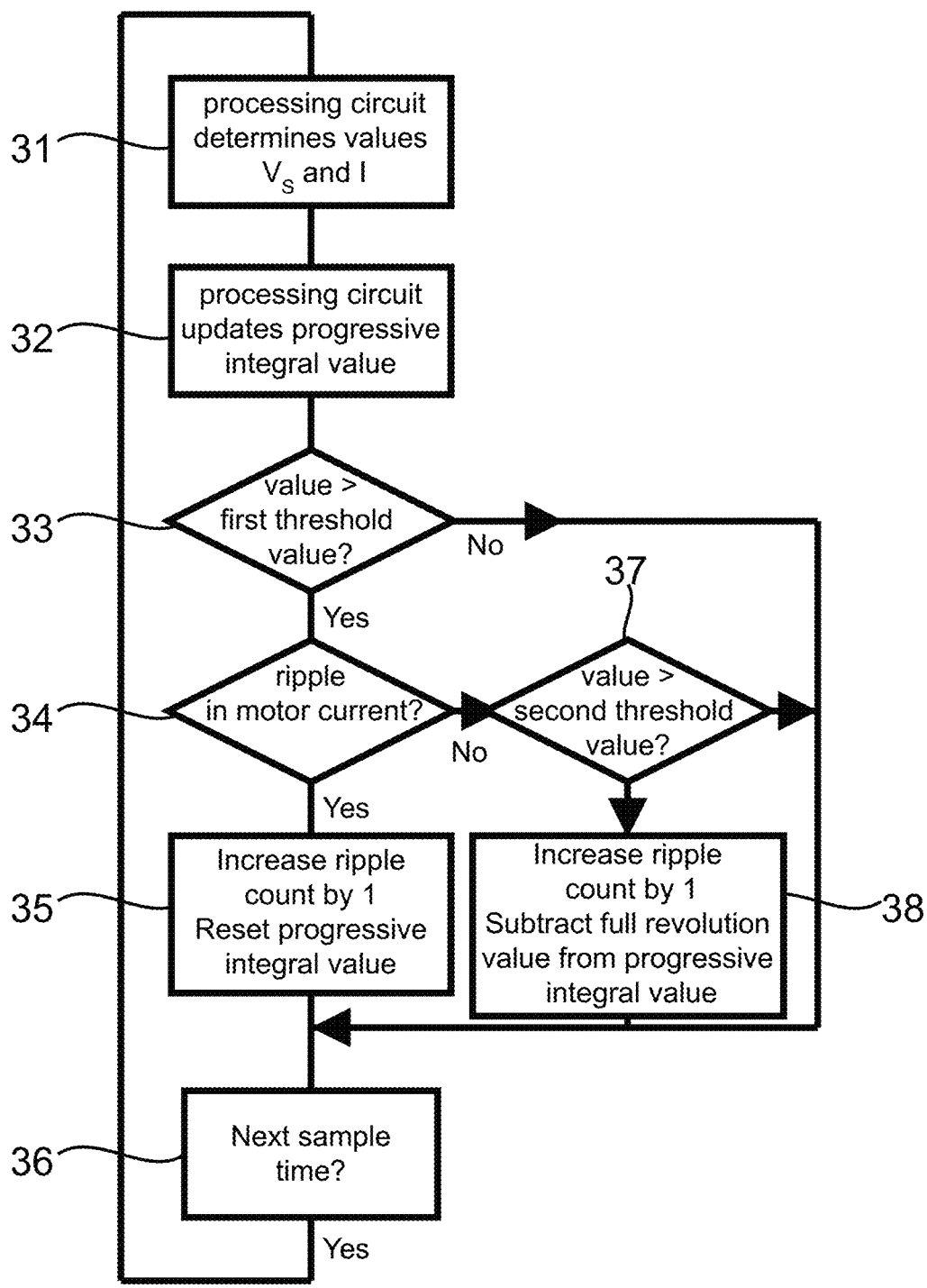

RESISTANCE DETERMINATION IN AN ELECTRIC MOTOR ASSEMBLY

CROSS REFERENCE TO RELATED APPLICATIONS

This application is a continuation of U.S. patent application Ser. No. 17/430,826, filed Aug. 13, 2021, which is a 35 USC § 371 National Stage application of International Patent Application No. PCT/NL2020/050082, which was filed Feb. 14, 2020, entitled "RESISTANCE DETERMINATION IN AN ELECTRIC MOTOR ASSEMBLY" which claims priority to Patent Application No. NL 2022591, filed Feb. 15, 2019 and is incorporated herein by reference as if fully set forth.

FIELD OF THE INVENTION

The invention relates to an electric motor assembly.

BACKGROUND

For various purposes it is desirable to measure the electrical resistance of windings of conductor coils in the rotor of an electric motor in its working environment, for example to determine how the temperature of environment has affected the resistance. One application is when the resistance value is used to estimate the motor speed from the current through the electric motor and the voltage applied to the electric motor. Other applications include use of the resistance value to estimate the motor temperature, e.g. as part of an over-temperature protection mechanism.

WO2016/080834 describes the determination of the number of revolutions of an electric motor by counting ripples in the electric current supplied to the motor. Such ripples occur at predetermined motor rotation angles. When ripples are detected each time when the motor reaches such an angle, there is a predetermined ratio between the number of detected ripples and the number of revolutions of the electric motor. However, the accuracy of the number of revolutions can be negatively affected by missing ripple detections and false ripple detections. This problem can be reduced by correcting the ripple count when no ripple has been detected at all in a time interval where one was expected, more than one was detected in such a time interval, or when ripples are detected in other time interval where none are expected.

DE19729238 discloses methods of determining motor speed of mechanically commutated DC motors. The method detects commutation times from motor current ripples, considering only commutation times within a predicted acceptable time range and extrapolated probable commutation times otherwise. The motor speed and/or angle of rotation are determined from the commutation times.

PCT application number PCT/NL2018/050673 (not published at the priority date of the present application) describes a way of determining the time intervals wherein ripples are expected in the motor current. This is based on a physical relation between the motor rotation frequency, the motor supply voltage, and the product of the motor winding resistance value and the electric current I through the motor. Herein, the supply voltage is fixed, or can be measured and the electric current I can be measured, so that when the motor winding resistance value is known, the expected duration of a motor revolution wherein the motor returns to the same motor rotation angles can be predicted.

The PCT/NL2018/050673 describes that the motor winding resistance value can be obtained as pre-stored typical value or by measuring the current when the motor's back EMF is negligible.

JP2011087402 discloses a motor controller that accurately estimates an angular motor velocity without using a high-precision motor angle detection sensor, independent temperature changes or manufacturing variations using an averaged resistance value. The rotation speed is determined from a back electromotive force generated in windings of the electric motor, or motor resistance. The current flowing in the electric motor and the voltage applied to the electric motor are detected. Integrated current and voltage values to determine an accurate resistance. Sensors may be used to detect coil; brush and substrate temperatures, making it possible to obtain temperature dependent winding, brush and contact resistance values using resistance maps.

US2013035816 discloses motor control of vehicle motors wherein resistance effects on the motor speed are compensated as part of motor control. The compensation term is developed dynamically using a stored profile of a motor performance parameter.

SUMMARY

Among others, it is an object to improve the accuracy of the determination of electric motor revolutions from ripple counting.

An electric motor assembly is provided, comprising an electric motor, a current sensor, a temperature sensor, and a processing circuit. The electric motor comprises brushes and sections of a commutator ring, wherein positions of the sections and the brushes change relative to each other during rotation of the motor. The current sensor is coupled to the electric motor to measure an electric current to the electric motor, and the temperature sensor is thermally coupled to the electric motor. The processing circuit includes inputs coupled to outputs of the current sensor and the temperature sensor, wherein the processing circuit is configured to determine a motor resistance value by determining predicted values of the motor resistance for a first and second position of the sections relative to the brushes, at least one of the brushes contacting different numbers of the sections in the first position and the second position respectively. The predicted values are based on a temperature value measured by the temperature sensor and a predetermined dependence of variation of the motor resistance dependent on the temperature value. The processing circuit is further configured to determine the motor resistance value by determining an electric current value measured by the current sensor, when the electric motor is at least substantially at standstill; by selecting between different ways for determining the motor resistance value using the electric current value, dependent on which of the predicted values of the motor resistance most closely corresponds to the electric current value; and by determining the motor resistance using said electric current value according to the selected way.

Herein a processing circuit uses a temperature sensor to determine how a motor resistance will be determined from a measurement of the current to the motor when the motor is at least substantially at standstill. In principle a resistance can be determined by dividing the motor supply voltage by the measured motor current (a predetermined nominal value of the supply voltage may be used or the supply voltage may be measured as well). However, the result depends on the position of the motor: there is a different relation between the motor voltage/current ratio and the winding resistance at different positions dependent on number of the sections that a brush contacts at the same time. For example, in an embodiment, each of the brushes contacts only one section at a first position, and one of the brushes contacts two sections simultaneously at a second position. The processing circuit of the electric motor assembly provides for the determination of a position independent motor resistance value by using a temperature sensor to select between different ways of determining the motor resistance value using the measured current. The processing circuit uses the measured temperature and a known predicted relation between the temperature and the winding resistance value to predict motor resistance values for the different relative positions of the brushes and the commutator. The processing circuit selects the way in which the motor resistance value is determined based on which prediction is closest to the resistance that corresponds to the current measurement.

Usually, the selection between different ways to determine the motor resistance value comes down to selecting between different factors to be applied to the current measured at standstill. As used herein, this is referred to as use of the resistance value, even when the resistance value is not explicitly determined.

In an embodiment, the motor resistance value is used to improve the reliability of a ripple count that is representative of a number of revolutions of the electric motor. For this compute the processing circuit computes an progressive integral of V−I*R, wherein V is the supply voltage of the electric motor, I is the current to the electric motor and R is the motor resistance value that has been determined as claimed in claim 1.

In an embodiment, the electric motor assembly may comprise a plurality of motors coupled to a same object that has to be moved and/or rotated. In this case, the processing circuit may use the temperature sensor for determinations of motor resistance values of all motors. Since the measured temperature is used only to select between different ways for each of the motors, it does not matter that the actual temperatures of some or all of the motors may be somewhat different from the temperature of the temperature sensor. Hence different temperature sensors for the different motors are not needed.

In an embodiment, the processing circuit is configured to use the motor resistance value for over temperature protection of the motor or motors. The motor resistance value is representative of the actual motor temperature for this purpose. The selection of the way how the motor resistance value is determined increases the accuracy of the motor resistance value and hence reduces the size of safety margins that could give rise to false over temperature alarms.

BRIEF DESCRIPTION OF THE DRAWING

These and other objects and advantageous aspects will become apparent from a description of exemplary embodiments with reference to the following figures.

FIG. 3 shows a flow chart that illustrates a method of computing a ripple count

DETAILED DESCRIPTION OF EXEMPLARY EMBODIMENTS

Figure 1:
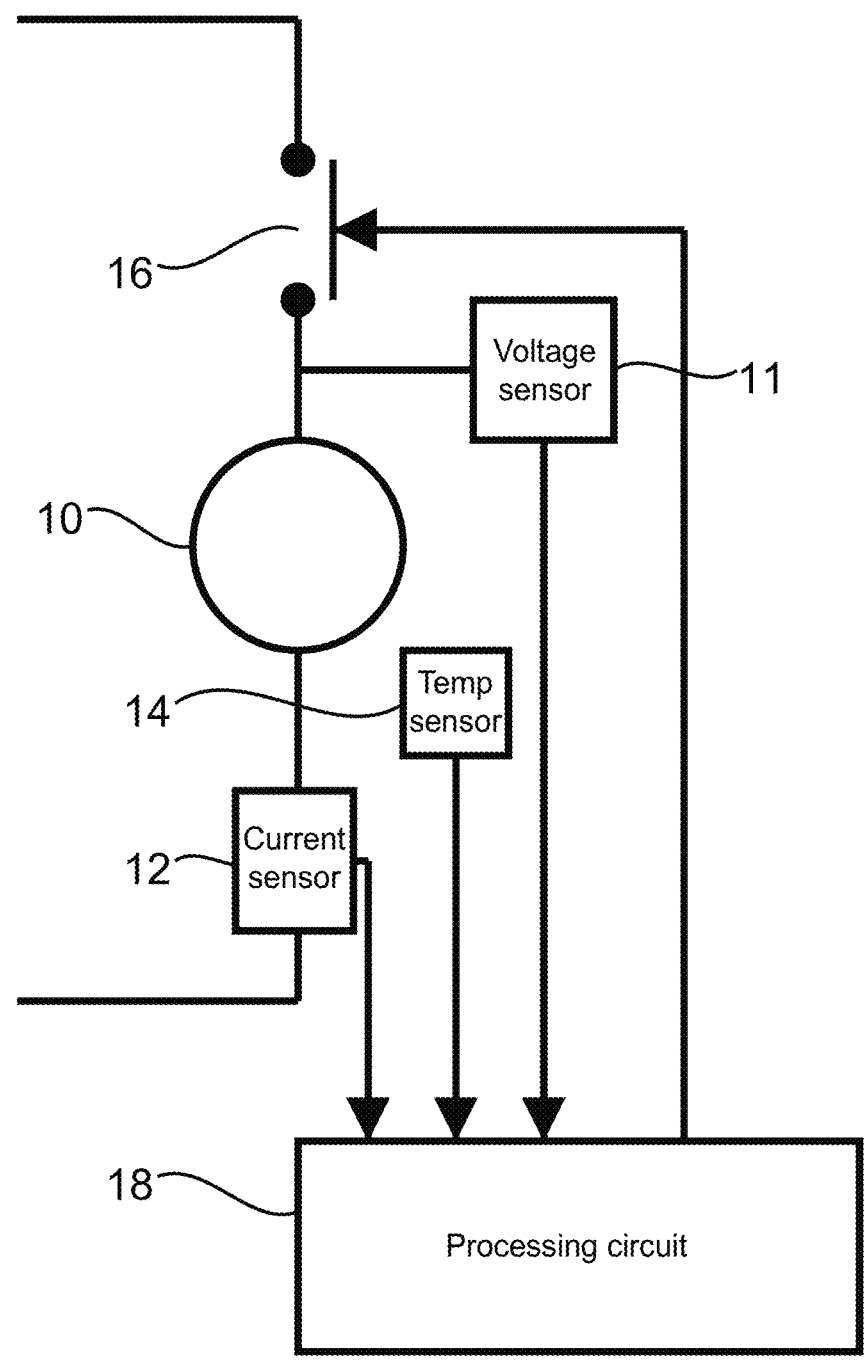
FIG. 1 shows a motor assembly

FIG. 1 shows an embodiment with a motor assembly with an electric motor 10, a voltage sensor 11, a current sensor 12, a temperature sensor 14, a motor switch 16 and a processing circuit 18. Motor 10, current sensor 12 and motor switch 16 are connected in series to an external voltage source (not shown). Any sequence of motor 10, current sensor 12 and motor switch 16 may be used in the series connection. Motor switch 16 may comprise a switching transistor for example.

Temperature sensor 14 is mounted in thermal communication with motor 10. Processing circuit 18 is coupled to voltage sensor 11 and current sensor 12. Voltage sensor 11 is connected to measure the voltage across motor 10 and current sensor 12 is connected to sense the current through motor 10. Voltage sensor 11, current sensor 12 and temperature sensor 14 have outputs coupled to processing circuit 18. Furthermore, processing circuit 18 has a command input and a control output coupled to a control input of motor switch 16. Current sensor may comprise a current sensing resistor connected in series with motor 10 and a further voltage sensor connected to sense a voltage across the current sensing resistor. Preferably, the current sensing resistor is of a known resistor type that ensures that the resistance value of the current sensing resistor is substantially temperature independent, or at least less temperature dependent than the resistance of the windings of motor 10. But if the current sensing resistor has no close thermal coupling to the windings of motor 10, it may also have the same temperature dependence as the windings. In other embodiments. A hall sensor or other current sensor may be used to measure the current instead of a current sensing resistor and voltage sensor. The voltage sensor(s) may comprise an analog to digital (ND) converter, voltage sensor 11 and current sensor 12 may share an ND converter.

Processing circuit 18 may be a programmable (micro-) computer with a program memory containing instructions that control its operation. Alternatively processing circuit 18 may comprise more than one computer, or processing circuit 18, may comprise a hardwired circuit. As used herein, when the processing circuit 18 is comprises a computer and it is described that the processing circuit 18 is described to perform a function or described as configured to perform a function, this should be understood to mean that the computer has a program memory containing instructions to make processing circuit 18 perform that function. Mutatis mutandis this also applies in implementations using a hardwired processing circuit 18.

In an embodiment the motor assembly may be part of an auxiliary adjustment mechanism used for mechanically adjusting the position of parts in a vehicle. In such applications, motor 10 is a relatively small motor compared to the vehicle's main motor. For example such an auxiliary adjustment mechanism may be used for folding in a rear view mirror, and/or adjusting its orientation, for adjusting a camera orientation, or for adjusting aerodynamic structures. Thus, the motor assembly may be part of rear view mirror assembly of a vehicle, a camera unit etc. Motor 10 may be coupled to the positionable part e.g. via a gear system.

Figure 2:
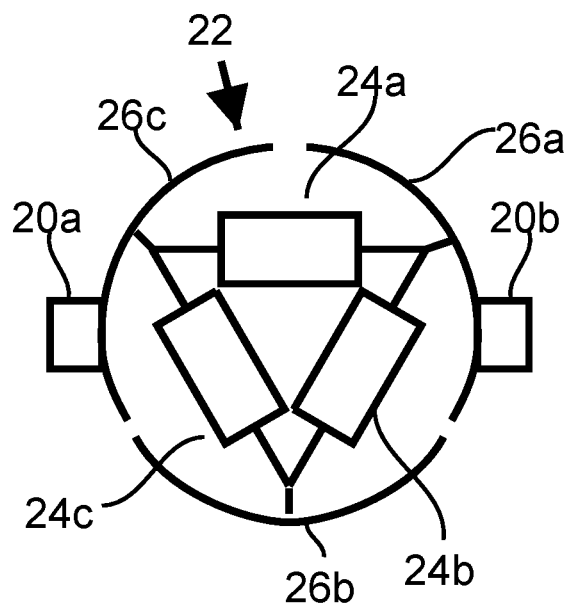
FIG. 2, 2a show illustrative cross sections of a DC electromotor

FIG. 2 shows an illustrative cross section of part of a simple DC electric motor, comprising brushes 20 and a rotor 22. Rotor 22 comprises three motor coils 24a-c (symbolically shown as boxes) and a commutator ring with three sections 26a-c. Typically the motor coils 24a-c will be configured to produce a magnetic field or field component in the radial direction of rotor in response to current through the windings, e.g. by means of a magnetizable yoke (now shown). Furthermore, the DC electromotor comprises stator magnets (not shown). Each motor coil 24a-c is electrically connected between a respective pair of the sections 26a-c. Brushes 20 are fixed during rotation of rotor. During operation of the motor, rotor 22 rotates. As used herein, this will be referred to as rotation of the motor or revolution of the motor. It should be noted that in more complicated motors more motor coils, a commutator ring with more sections and/or more brushes may be present.

It should be noted that other types of electric motors may have a different number of motor coils 24a-c (one symbolically shown as windings, the others as boxes) and sections. For example, any other number of n sections may be used, with n motor coils, each coupled to a successive pair of sections.

Processing circuit 18 is configured (e.g. programmed) to determine a resistance value R of motor 10 or, equivalently, a resistance value of the windings of a single motor coil 24, in the operating environment of the electric motor. The resistance value is a result of the resistance of the windings of coils 24a-c and of brushes 20a,b, although in most cases the resistance of brushes 20a,b is negligible compared to that of motor coils 24a-c, so that it can be ignored. As will be explained, processing circuit 18 may be configured to use a determination of the resistance value R to improve the reliability of a ripple count to determine a number of revolutions of the rotor, and more generally as part of an estimation of motor position and speed. In other applications the resistance value may be used to estimate the motor temperature, e.g. as part of an over-temperature protection mechanism.

In principle a resistance value R of motor 10 can be determined from a ratio of the measured current I through the motor and a supply voltage V through the motor when the motor is at standstill or the motor moves so slowly that it can be said to be substantially at standstill. The motor can be substantially at standstill e.g. when it has to overcome friction forces from a slipping coupling or another counter-force, or when it slowly starts rotating from standstill. The motor can be said to be substantially at standstill when the back-emf of the motor is much less than the voltage drop due to the motor resistance, e.g. when the back emf is less than 20% of the voltage drop due to the motor resistance. Processing circuit 18 may use measurements from voltage sensor 11 and current sensor 12 at a time point when the motor is at least substantially at standstill to determine this ratio. However, the relation between this ratio and the winding resistance of the motor coils depends on the rotational position of the motor at the time of measurement.

Figure 2A:
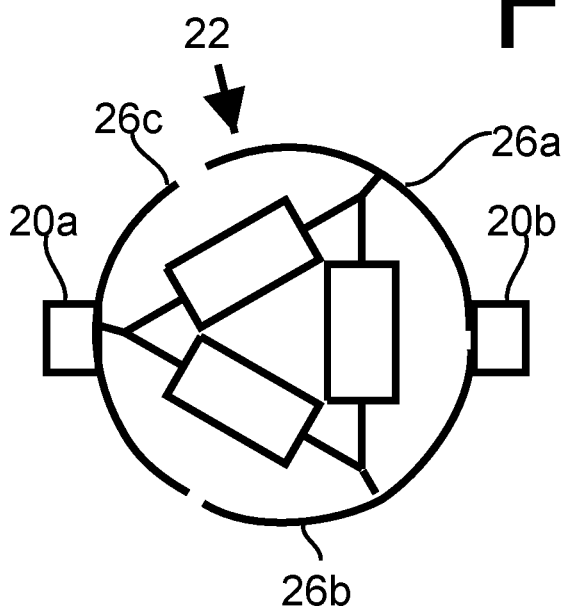

FIG. 2a illustrates the dependence of the measured resistance between the brushes on the rotational position of the motor at the time of measurement. In FIG. 2a, commutator sections 26a-c of the commutator ring are located so that a first brush 20a contacts two sections 26a-c of the commutator ring at the same time. This should be contrasted with the rotational position shown in of FIG. 2, wherein both brushes 20a, b each contact only one sections 26a-c of the commutator ring.

In the case of FIG. 2, the winding resistance between brushes 20a,b is the parallel circuit resistance of two branches, the first branch containing the winding resistance R1 of a single coil, and the second branch containing the series resistance 2*R1 of the winding resistances R1+R1 of two coils. The resulting resistance value between brushes 20a,b is 2*R1/3. In the case of FIG. 2a, the winding resistance between brushes 20a,b is the parallel circuit resistance of two branches, that each contain a single coil, so that the resulting resistance value between brushes 20a,b is R1/2. As may be noted, a similar effect may occur when the brushes are on the rotor and the commutation ring does not rotate.

More generally, expressions for the resistances of the networks of resistors between the brushes that occur at different brush positions can be expressed in terms of the resistance R1 of the coils, according to the conventional way of expressing the resistance of a resistor network in terms of the resistances of its component resistors.

Thus similar expressions can easily be derived when the motor has more commutator sections and/or more coils. This is also so for motor configurations wherein each brushes normally contacts a plurality of commutator sections and the number of contacted commutator sections can change by plus or minus one. If coils with predetermined ratios between the resistances are used in the same motor, instead of using the same resistances for all coils, expressions for the resistances between the brushes can also be derived. For the resistance value, it does not matter whether the motor is a DC motor or an AC motor. Generally, the expressions for the resistance between the brushes that apply at different brush positions are different factors times a reference resistance R1, where the reference resistance R1 will depend on temperature.

For example, when an odd number of 2*n+1 sections is used, with 2*n+1 motor coils of the same resistance R1, each coupled to a successive pair of sections, and the brushes are located at diametrically opposite positions the resistance may be n*(n+1)*R1/(2*n+1) when the brushes both contact only one section, whereas the resistance may be n*R1/2 when the brushes both contact two sections. That is, the resistance values differ by a factor 2*(n+1)/(2*n+1).

Similarly, when an even number of 2*n sections is used, with 2*n motor coils of resistance R1, each coupled to a successive pair of sections, and the brushes are located at diametrically opposite positions the resistance may be n*R1/2 when the brushes both contact only one section, whereas the resistance may be (n−1)*R1/2 when the brushes both contact two sections.

In view of uncertainty about the rotational position of the rotor when the rotor is at standstill, processing circuit 18 cannot determine from the voltage and current in which configuration it measures the resistance value between the brushes. Hence processing circuit 18 cannot determine the resistance value R1 of a single coil from the voltage and current alone. Processing circuit 18 uses input from temperature sensor 14 to determine which resistance value should be used.

Given predetermined approximate values of the resistance value R1 of a single coil as a function of temperature, and temperature measured with temperature sensor 14, predicted resistance values between brushes 20a,b in the configurations of FIGS. 2 and 2a can be predicted. Based on these predictions, the configuration that yields the predicted resistance value closest to the measured resistance value Rm can be selected. Then the resistance value R1 of a single coil can be computed from the measured resistance value Rm according to the configuration that yields the closest predicted resistance value, i.e. according to R1=2*Rm or R1=3*Rm/2, in the example according to the configuration of FIGS. 2 and 2a respectively.

Usually, the selection between the different ways of computing the resistance value comes down to selecting between different factors (2 or 3/2 in the example of FIGS. 2 and 2a). In practice it may not be necessary to compute R1 explicitly: instead some other quantity that depends on R1 may be computed in different ways (e.g. with different factors) dependent on the temperature. For example, when the other quantity is the resistance of the motor during most of the rotation, the measured resistance value Rm may be used, or 4*Rm/3 if the comparison of the measured value and the values predicted on the basis of the measured temperature indicates that the configuration of FIG. 2a occurred when Rm was measured.

As a first application, an application to ripple counting will be described.

In an embodiment of this application, processing circuit 18 is configured to receive commands to cause motor 10 to rotate, to cause motor switch 16 to supply a voltage to motor 10 in response, to determine the number of revolutions of motor 10 and to cause motor switch 16 to stop supplying the voltage to motor 10 once processing circuit 18 has counted a predetermined number of revolutions.

Current sensor 12 measures the electric current through motor 10. Processing circuit 18 is configured to detect ripples (i.e. peaks and/or dips) in the current through motor 10 and count the ripples to determine the number of revolutions. In an embodiment only a fixed fraction of the ripples is counted, e.g. only every second ripple, or more generally every nth ripple, wherein n is a natural number. During the rotation current ripples typically occur when a next section 26a-c of the commutator ring comes into contact with a brush 20 during rotation of rotor 22. This occurs at predetermined rotation angles of rotor 22 relative to brushes. Therefore, by counting the ripples, or a fixed fraction of the ripples the number of revolutions of rotor motor can be determined.

However, the ripple count may become unreliable because of false ripple detections or missing ripple detections. Such errors are relatively more significant for smaller electric motors. Thus, especially for small motors such as used in rear view mirror adjustment mechanisms and the like, such errors may be significant. Processing circuit 18 is configured to reduce the effect of such errors by computing predictions when ripples are expected and when not, and to correct ripple detection and counting based on the prediction. To do so, a method of determining the duration of revolutions of the motor may be used that is more robust than ripple counting. Even if such a more robust method determines the motor speed less accurately than error free ripple counting, its ability to predict roughly when a next ripple should be expected after a preceding ripple enables correction for ripple detection errors.

In particular the accumulated back EMF of the motor may be used for predicting when the next ripple should roughly be expected. The back emf voltage $V_e$ is produced by change of the magnetic field due to the rotation of the motor coils 24 in the magnetic field from the stator magnets. The back emf voltage is proportional to the angular rotation speed of the motor, with a fixed constant of proportionality.

In an electric motor circuit the following relation between the back emf voltage $V_e$ the supply voltage difference $V_s$ is applied to brushes 20 and the electric current I through the motor approximately applies $$V_s = V_e + R*I$$

Herein R is the resistance value of the motor due to the windings of the motor coils connected between brushes 20 plus the resistance of brushes 20. For the purpose of determining the average back emf voltage, this motor resistance corresponds to that with relative positions of the brush and the segments of the commutator ring that yield the same motor resistance as in the configuration of FIG. 2. In principle, this relation between the back emf voltage the supply voltage difference and the electric current can be used to determine the number of revolutions during a time interval by integrating $V_s - R*I$ over that time interval, using measured values of $V_s$ and I and dividing by the constant of proportionality. In practice such a computation results in less accurate revolution count than error free ripple counting, but it is more robust against ripple detection errors.

When processing circuit 18 uses such a computation to predict the location of a next ripple, it can be used to make ripple counting more accurate. The time interval T between ripples that occur when the rotor successively reaches the same rotation angle corresponds to a single revolution of the motor. The integral of $V_s - R*I$ over the time interval T of a single revolution of the motor is a predetermined constant value. Therefore, when an integral is computed progressively (i.e. computed for progressive values of the upper bound of the integration interval), starting from a time point of a first ripple, the next ripple at the same rotation angle as the first ripple should occur when the progressive integral (the integral computed for progressive values of the upper bound of the integration interval) reaches this predetermined value. Due to inaccuracies this will not be exactly the case, but processing circuit 18 may be configured to derive a time window from the progressive integral in which the next ripple is expected.

For example processing circuit 18 may determine that this time window starts when the progressive integral of $V_s - R*I$ reaches a first threshold value below the full revolution integral value that nominally results from a single revolution of the rotor (e.g. 0.9 times the full revolution integral value). Similarly, processing circuit 18 may determine that this time window ends when the progressive integral of $V_s - R*I$ reaches a second threshold value above the full revolution integral value (e.g. 1.1 times the full revolution integral value). Processing circuit 18 counts only one ripple for each such time interval, and reduces the progressive integral by its value at the time when a ripple is detected in the time interval. If the ripple is detected without delay or almost without delay, the reduction may be simply performed by resetting the progressive integral to zero. When no ripple is detected in the time interval, one ripple is still counted and the progressive integral is reduced by a predetermined value that corresponds to the integral over exactly one revolution.

Although this method has been described for a full revolution of the motor, it should be noted that, when more than one ripple systematically occurs during a revolution, the method can also be used with a plurality of time windows during a revolution, for rotational positions at fractions of the revolution at which the ripple systematically occur.

FIG. 3 shows a flow chart that illustrates a method of computing a ripple count performed by processing circuit 18. It should be noted that the flow chart illustrates a principle of this computation, and that variations of the method are possible. The steps of the flow-chart may be preceded by initialization steps (not shown) wherein a ripple is detected and the computation of the progressive integral is started from that time point. In a first step 31, processing circuit 18 determines the values of the supply voltage $V_s$ and motor current I from the output of sensors 11, 12. Although an embodiment is described wherein the voltage that is supplied to the motor is measured, it may be noted that in some cases it may suffice to use a predetermined motor supply voltage value. In that case, no voltage sensor 12 is needed.

In a second step 32, processing circuit 18 updates the progressive integral value of $V_s - R*I$ using the supply voltage $V_s$ and motor current I obtained in first step 31. As used herein, the term "integral" is used for a continuous integral or any time discrete value determined by a time discrete computation that approximates continuous integration. One way of time discrete computation is to use a sum of $V_s-R*I$ values for sample time points as the integral, so that the progressive integral values for successive sample time points can each be computed by adding the value of $V_s-R*I$ for the time point to previous progressive integral value.

In third step 33, processing circuit 18 tests whether the progressive integral value exceeds the first threshold value. If so, processing circuit 18 proceeds to a fourth step 34 wherein processing circuit 18 determines whether the motor current values show that a ripple has occurred in the motor current while the progressive integral value exceeded the first threshold.

If so, processing circuit 18 proceeds to a fifth step 35 wherein processing circuit 18 increases the ripple count by one and resets the progressive integral value, i.e. it resets the starting time point of the progressive integral value to the time of the detected ripple (or equivalently, subtracts the progressive integral value at the time of the detected ripple from the progressive integral value that will be used for detecting the next ripple). From fifth step 35 processing circuit 18 proceeds to a sixth step 36, from where processing circuit 18 repeats from first step 31, once a next sample time point is reached.

If processing circuit 18 finds no ripple in fourth step 34, processing circuit 18 executes a seventh step 37, wherein processing circuit 18 tests whether the progressive integral value exceeds the second threshold value. If so, processing circuit 18 executes an eighth step 38, wherein processing circuit 18 increases the ripple count by one, despite the fact that no ripple has been detected, and processing circuit 18 subtracts the full revolution integral value from the progressive integral value. From eighth step 38, processing circuit 18 proceeds to sixth step 36. Similarly, when processing circuit 18 determines in third step 33 that the progressive integral value does not exceed the first threshold value, or finds no ripple in fourth step 34, processing circuit 18 proceeds to sixth step 36.

As noted, variations are possible. For example, instead of executing fifth step 35 in response to the first detected ripple after the integral exceeds the first threshold, a search may be made for the most likely correct ripple detection while the integral is between the first and second threshold and the progressive integral value at the time of that ripple may be subtracted from the progressive integral value that will be used for detecting the next ripple.

That is, instead of repeating all steps at each time point, the measured current values may be sampled and recorded during the time window, the most likely time point of a ripple, if any, may be determined afterward from the recorded samples, and used to select the value of the integral for that time point, to subtract the selected value from the progressive integral. In a further embodiment the measured current values may also be sampled and recorded outside the time window, and the location of the time window in the recorded values may be determined from the recorded values.

It should be noted that this method requires a value of the resistance R of the windings of the motor coils and the brushes through which the motor current flows. In practice, this resistance depends on the temperature of the environment. It has been found that in some environments, such as in auxiliary adjustment mechanisms used for mechanically adjusting the position of parts in a vehicle, the temperature of the resistance can significantly affect the reliability of the ripple count determination. To remove this source of unreliability processing circuit 18 is configured to measure an indication of the resistance value R at standstill of the motor, i.e. when the back EMF voltage is zero, and to use a resistance value that it derives from this indication in the computation of the progressive integral value in the method of FIG. 3.

In principle the resistance value R can be determined from a ratio of the measured current I through the motor and a supply voltage V through the motor before the motor starts to rotate. However, as discussed in relation to FIGS. 2, 2a the relation between this ratio and the winding resistance of the motor coils depends on the rotational position of the motor at the time of measurement. When the comparison of the measured resistance value Rm and the resistance values predicted on the basis of the measured temperature indicates that the configuration of FIG. 2a occurred when Rm was measured.

Figure 4:
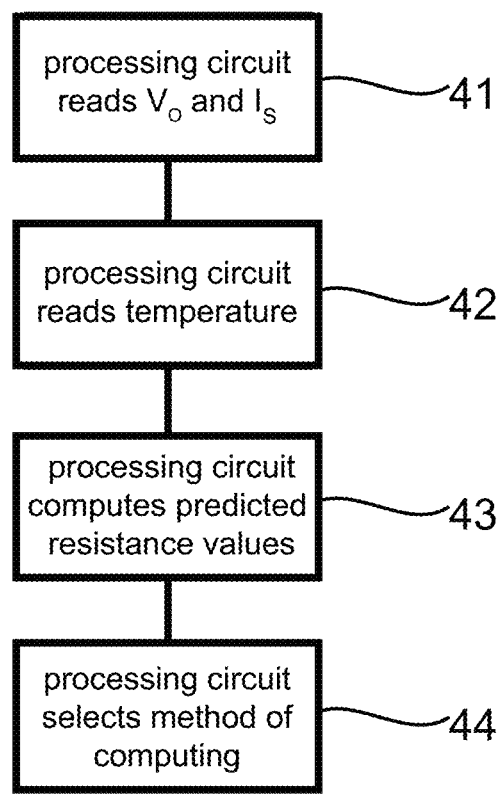
FIG. 4 shows a flow chart that illustrates a method of computing a motor resistance

FIG. 4 shows a flow chart of the determination of the resistance value R. In a first step 41, processing circuit 18 reads a voltage Vo and a current Is sensors 11, 12 at a time when the motor is at standstill (e.g. by applying only a small supply voltage that is insufficient to overcome motor friction, or when the motor is inhibited from moving by a stop structure, or directly after a time interval in which no motor supply voltage is applied). In a second step 42, processing circuit 18 reads a measured temperature from temperature sensor 14 at substantially the same time. In a third step 43, processing circuit 18 computes predicted resistance values on the basis of the measured temperature for the configurations of different positions of the rotor of the motor. In a fourth step 44 processing circuit 18 selects a method of computing the resistance value R from the measured resistance value according to the configuration that yields the closest predicted resistance value. Herein the closest values may correspond to the prediction for which the absolute value of the difference with Vo/Is is smallest. But instead other criteria for closeness may be used, such as whether the ratio of Vo/Is to the smallest of the predicted value is smaller than the ratio of the largest predicted value to Vo/Is. In a fifth step 45 processing circuit 18 computes the resistance value R according to the selected method. In the example of FIGS. 2 and 2a, the motor resistance value R may be taken as Vo/Is when the predicted resistance when no brush contacts more than one commutator section is closest to Vo/Is and 4*Vo/(3*Is) otherwise. Processing circuit 18 uses the computed resistance value R in the method illustrated by FIG. 3.

As may be noted, this means that the integrand could be rewritten as $V_s-c*I*Vo/Is$ and c is a factor (c=1 or 4/3) determined by the criteria as described with reference to FIG. 4. If Vs=Vo this reduces to $V_s-c*(I/Is)*Vs$.

Optionally, processing circuit 18 is configured to update the resistance value R dynamically during rotation, based on detection of temperature changes by temperature sensor 14 and a predetermined temperature dependence. When it is known that the winding resistance R1 depends on temperature according to R1=R10*F(T), wherein T is the temperature of the windings and the function F(T) represents the predetermined temperature dependence, processing circuit 18 may compute the updated resistance during rotation according to R=Rs*F(T)/F(Ts), wherein the resistance is the resistance determined from the measurements at standstill, and the temperature Ts is the measured temperature at that time. In most cases, a linearized version of such a computation may be used: R=Rs*(1+alpha*(T−Ts)), wherein alpha is a predetermined temperature coefficient. Use of dynamic temperature dependent updates can make ripple counting more reliable.

Figure 5:
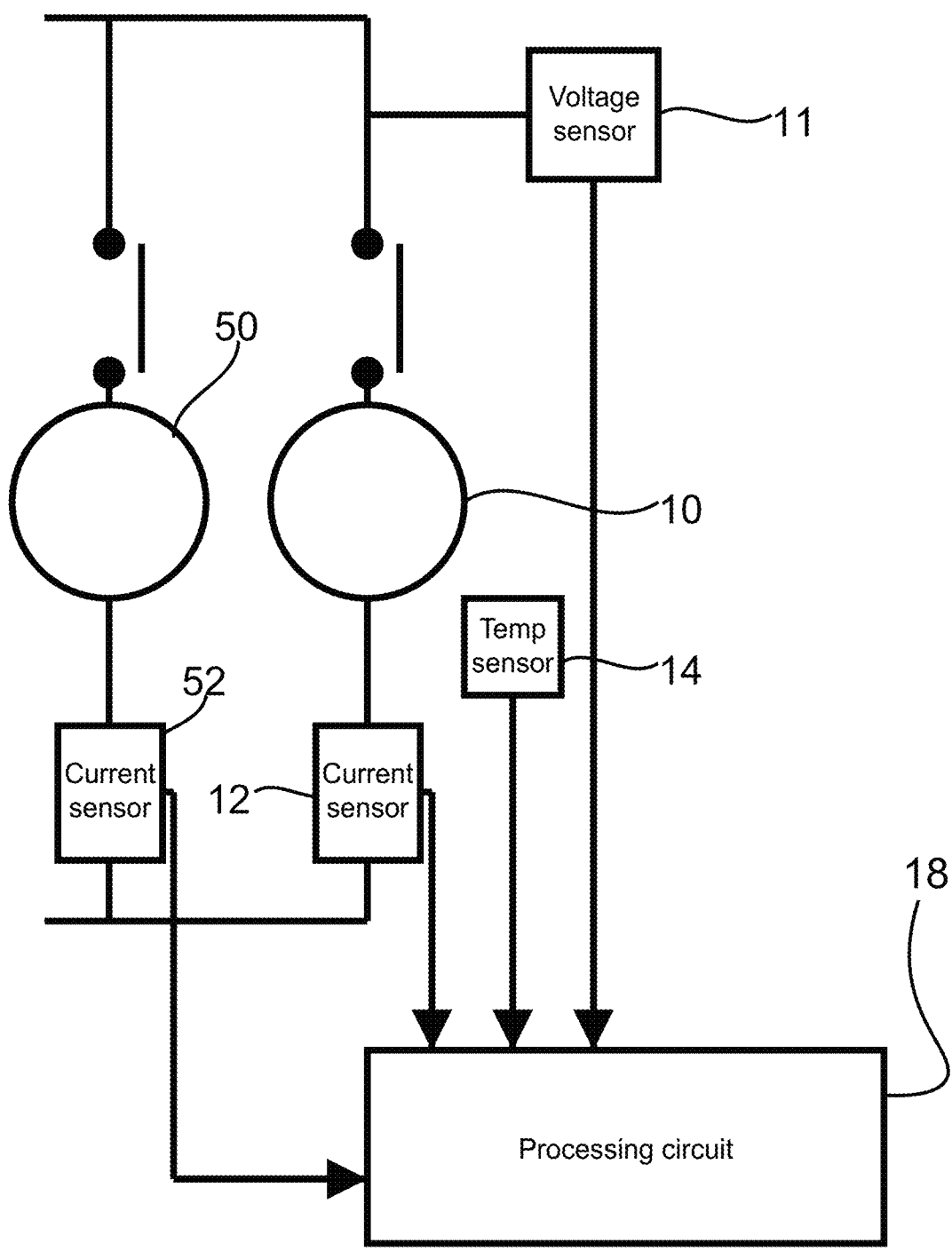
FIG. 5 shows a motor assembly with a plurality of motors

FIG. 5 shows an embodiment of a motor assembly wherein a first electric motor 10 and second electric motor 50 are mechanically coupled to an object (not shown) that has to be repositioned, i.e. moved and/or rotated. The type of object depends on the application. In the case of a motor vehicle application, for example the object that has to be repositioned could be a mirror, or a camera, or a flap of an air inlet or an active air dam (AAD) among others. First motor 10 and second motor 50 may be coupled to the object e.g. via a gear system. First motor 10 and a second motor 50, are each in a respective series connection with a motor switch and a current sensor 12, 52 and coupled to processing circuit 18. Processing circuit 18 may have control outputs (not shown) to the motor switches of first and second motor 10, 50.

In operation, when motors 10, 50 reposition the object, control circuit 18 activates both motors 10, 50 by means of the motor switches. Due to differences in motor torque and resistance to motor movement, the durations during which motors 10, 50 are active may need to be different even when motors 10, 50 have to perform the same number of rotations and motors 10, 50 are identical and receive the same voltage and current. Processing circuit 18 is configured to determine these durations base on the ripple counts of motors 10, 50, by a method such as disclosed in relation to FIG. 3. In this method, processing circuit 18 uses for the resistance value R a first resistance value that processing circuit 18 has determined for first motor 10 and a second resistance value that processing circuit 18 has determined for second motor 50.

In the illustrated embodiment, processing circuit 18 uses temperature measurements from temperature sensor 14 in determinations of both the first and second resistance value, each by a method such as disclosed in relation to FIG. 4. This temperature sensor 14 may be included in a housing (not shown) that also contains first motor 10, and optionally processing circuit 18, with second motor 50 located outside this housing. First and second motor 10, 50 operate in the same environment, e.g. coupled to a single object that has to be positioned, and will therefore have similar temperatures, even though their temperatures may be different. This suffices for the determination of the motor resistances, since the measured temperature is only used to select between different determinations of the motor resistance from the voltage and current.

Although an embodiment has been described wherein the resistance value is used for selecting ripples for ripple counting e.g. to count revolutions of the motor, other applications are possible. For example, the time windows may be used to control suppression of transmission of voltages or currents that contain ripples to sensitive circuits during the time windows. Thus ripples can be filtered out.

In another embodiment processing circuit 18 may be configured to estimate the temperature of the motor more accurately than possible with only temperature sensor 14, by using the measured motor resistance, i.e. substantially the coil winding resistance, as an indication of the temperature of the motor. In such an embodiment, temperature sensor 14 is used, but only to control how the motor resistance (or equivalently the winding resistance) is determined from the motor voltage and current. This has the advantage that the temperature sensor 14 does not need to be in very close thermal contact with the motor to determine the motor temperature.

In a further embodiment processing circuit 18 may be configured to perform over-temperature monitoring using the temperature of the motor (in particular its rotor) that has been estimated in this way. Processing circuit 18 may be configured to disconnect the motor from the supply voltage source, or disable power consumption by the motor in any other way, when the motor resistance that has been determined by a method such as disclosed in relation to the method of FIG. 4 exceeds a threshold value.

This may be applied to a motor assembly with a single motor. But it is especially advantageous for motor assemblies with more than one motor, as in the embodiment of FIG. 5, since it enables over-temperature monitoring of motors that are not in close thermal contact with the temperature sensor, for example when a motor is located outside the housing that contains the temperature sensor and optionally another motor.

The invention claimed is:

1. An electric motor assembly, comprising:
   an electric motor, comprising brushes and sections of a commutator ring, wherein positions of the sections and the brushes change relative to each other during rotation of the motor;
   a current sensor, coupled to the electric motor to measure an electric current to the electric motor;
   a temperature sensor, thermally coupled to the electric motor; and
   a processing circuit with inputs coupled to outputs of the current sensor and the temperature sensor, the processing circuit being configured to determine a motor resistance value by:
   determining predicted values of the motor resistance for a first position and a second position of the sections relative to the brushes, at least one of the brushes contacting different numbers of the sections in the first position and the second position respectively, the predicted values being based on a temperature value measured by the temperature sensor and a predetermined dependence of variation of the motor resistance dependent on the temperature value;
   determining an electric current value measured by the current sensor, when the electric motor is at least substantially at standstill;
   selecting between different ways for determining the motor resistance value using the electric current value, dependent on which of the predicted values of the motor resistance most closely corresponds to the electric current value; and
   determining the motor resistance using said electric current value that was selected using the electric current value based on which of the predicted values of the motor resistance most closely corresponds to the electric current value;
   wherein the processing circuit is configured to count ripples in the electric current to the electric motor during rotation of the electric motor and to compute a progressive integral of V−I*R, wherein V is the supply voltage of the electric motor, I is the current to the electric motor and R is the motor resistance value that has been determined, wherein the processing circuit increases the ripple count once for each time interval wherein a value of the progressive integral is between a first threshold and a second threshold, and reduces the value of the progressive integral by a value of the progressive integral at a time point in the time interval where the processing circuit detects a ripple in the current, or by a predetermined value when the processing circuit does not detects a ripple in the current in the time interval.

2. The electric motor assembly, according to claim 1, comprising an object to be moved and/or rotated, the electric motor being coupled to the object to move and/or rotate said object, the electric motor assembly comprising a further electric motor, coupled to the object to move and/or rotate said object, and a further current sensor coupled to the further electric motor to measure an electric current to the further electric motor, the processing circuit having a further input coupled to an output of the further current sensor, the processing circuit being configured to determine a motor resistance value of the further electric motor in the same way for the electric motor, using said temperature sensor for both, in combination with the current sensor and the further current sensor respectively.

3. The electric motor assembly according to claim 2, further comprising a housing, the electric motor and the temperature sensor being located within said housing, the further electric motor being located outside said housing.

4. The electric motor assembly according to claim 1, wherein the processing circuit is configured to compare the motor resistance value or a temperature determined from the motor resistance value with a threshold and to disable use of the electric motor when the motor resistance value or the temperature exceeds the threshold.

5. The electric motor assembly according to claim 1, wherein the selecting between different ways for determining the motor resistance value comprises selection between different factors to be applied to the electric current value measured by the current sensor substantially at standstill, dependent on which of the predicted values of the motor resistance most closely corresponds to the electric current value.

6. A method of determining a motor resistance of an electric motor, wherein the electric motor comprises brushes and sections of a commutator ring, wherein positions of the sections and the brushes change relative to each other during rotation of the motor, the method comprising the following steps executed by a processing circuit:
measuring an electric current value measured by the current sensor, when the electric motor is at least substantially at standstill;
measuring a temperature value using a temperature sensor thermally coupled to the electric motor;
determining predicted values of the motor resistance for a first position and a second position of the sections relative to the brushes, the predicted values being based on the temperature value and a predetermined dependence of variation of the motor resistance dependent on the temperature value, at least one of the brushes contacting different numbers of the sections in the first position and the second position respectively;
selecting between different ways for determining the motor resistance value using the electric current value, dependent on which of the predicted values of the motor resistance most closely corresponds to the electric current value; and
determining the motor resistance using said electric current value that was selected using the electric current value based on which of the predicted values of the motor resistance most closely corresponds to the electric current value;
wherein the processing circuit is configured to count ripples in the electric current to the electric motor during rotation of the electric motor and to compute a progressive integral of V−1*R, wherein V is the supply voltage of the electric motor, I is the current to the electric motor and R is the motor resistance value that has been determined, wherein the processing circuit increases the ripple count once for each time interval wherein a value of the progressive integral is between a first threshold and a second threshold, and reduces the value of the progressive integral by a value of the progressive integral at a time point in the time interval where the processing circuit detects a ripple in the current, or by a predetermined value when the processing circuit does not detects a ripple in the current in the time interval.

7. The method of determining a motor resistance of an electric motor and a further electric motor coupled to same object, wherein the electric motor and the further electric motor each comprise brushes and sections of a commutator ring, wherein the motor resistance values of the electric motor and the further electric motor are both determined according to the method of claim 6, the temperature value for both being determined using the same temperature sensor.

8. The method according to claim 7, wherein the electric motor and the temperature sensor are located within a housing and the further electric motor is located outside said housing.

9. The method according to claim 6, wherein the processing circuit is configured to compare the motor resistance value or a temperature determined from the motor resistance value with a threshold and to disable use of the electric motor when the motor resistance value or the temperature exceeds the threshold.

10. The method according to claim 6, wherein the selecting between different ways for determining the motor resistance value comprises selection between different factors to be applied to the electric current value measured by the current sensor substantially at standstill, dependent on which of the predicted values of the motor resistance most closely corresponds to the electric current value.

11. A non-transitory computer readable medium, comprising a program of instructions for a programmable processing circuit that, when executed by the programmable processing circuit, will cause the programmable processing circuit to execute the method of claim 6.

* * * * *